US009123665B2

(12) United States Patent
Sago

(10) Patent No.: US 9,123,665 B2
(45) Date of Patent: Sep. 1, 2015

(54) ORGANIC EL DEVICE, METHOD FOR MANUFACTURING THE SAME, AND ELECTRONIC APPARATUS

(71) Applicant: SEIKO EPSON CORPORATION, Tokyo (JP)

(72) Inventor: Takumi Sago, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 14 days.

(21) Appl. No.: 14/029,203

(22) Filed: Sep. 17, 2013

(65) Prior Publication Data

US 2014/0091287 A1 Apr. 3, 2014

(30) Foreign Application Priority Data

Oct. 1, 2012 (JP) ................................. 2012-219135

(51) Int. Cl.
*H01L 51/50* (2006.01)
*H01L 51/56* (2006.01)
*H01L 27/32* (2006.01)
*H01L 51/00* (2006.01)

(52) U.S. Cl.
CPC .......... *H01L 27/3211* (2013.01); *H01L 51/001* (2013.01); *H01L 51/0005* (2013.01); *H01L 51/504* (2013.01); *H01L 51/5012* (2013.01); *H01L 51/56* (2013.01); *H01L 51/0003* (2013.01); *H01L 51/006* (2013.01); *H01L 51/0008* (2013.01); *H01L 51/0077* (2013.01); *H01L 51/0078* (2013.01); *H01L 2251/56* (2013.01)

(58) Field of Classification Search
CPC .......................... H05B 33/0896–33/28; H01L 51/5036–51/5044; H01L 51/5012; H01L 51/0005; H01L 51/001; H01L 51/56; H01L 27/3206–27/3211
See application file for complete search history.

(56) References Cited

U.S. PATENT DOCUMENTS

| 6,833,156 | B2 | 12/2004 | Miyashita et al. |
| 7,871,711 | B2 | 1/2011 | Itai |
| 8,674,964 | B2 * | 3/2014 | Huang et al. ................... 345/175 |
| 2006/0284204 | A1 * | 12/2006 | Yamazaki et al. ............... 257/98 |
| 2007/0129613 | A1 * | 6/2007 | Rochester et al. ............ 600/310 |
| 2008/0048571 | A1 * | 2/2008 | Yoon et al. ...................... 257/13 |
| 2011/0114927 | A1 | 5/2011 | Obana et al. |

(Continued)

FOREIGN PATENT DOCUMENTS

| JP | A-2002-80841 | 3/2002 |
| JP | A-2007-73532 | 3/2007 |

(Continued)

*Primary Examiner* — Mariceli Santiago
(74) *Attorney, Agent, or Firm* — Oliff PLC

(57) ABSTRACT

An organic EL device has a pixel including a red, a green and a blue sub-pixel. The organic EL device includes anodes disposed in the sub-pixels, and a cathode. A red luminescent layer is formed by liquid application between the anode and the cathode, and a green luminescent layer is formed by liquid application between the anode and the cathode. A blue luminescent layer is formed by vapor deposition over the entire region of the red, green and blue sub-pixels between the red and green luminescent layers and the cathode, and between the anode and the cathode in the blue sub-pixel. An infrared luminescent layer is formed by vapor deposition over the entire region of the red, green and blue sub-pixels between the red and green luminescent layers and the blue luminescent layer, and between the anode and the blue luminescent layer in the blue sub-pixel.

15 Claims, 7 Drawing Sheets

(56) References Cited

U.S. PATENT DOCUMENTS

2012/0268003 A1* 10/2012 Fujita et al. .................. 313/504
2013/0037785 A1*  2/2013 Fujita et al. ................... 257/40
2013/0168654 A1*  7/2013 Fujita et al. ................... 257/40

FOREIGN PATENT DOCUMENTS

| JP | A-2011-108462 | 6/2011 |
| WO | WO 2005/101911 A1 | 10/2005 |

* cited by examiner

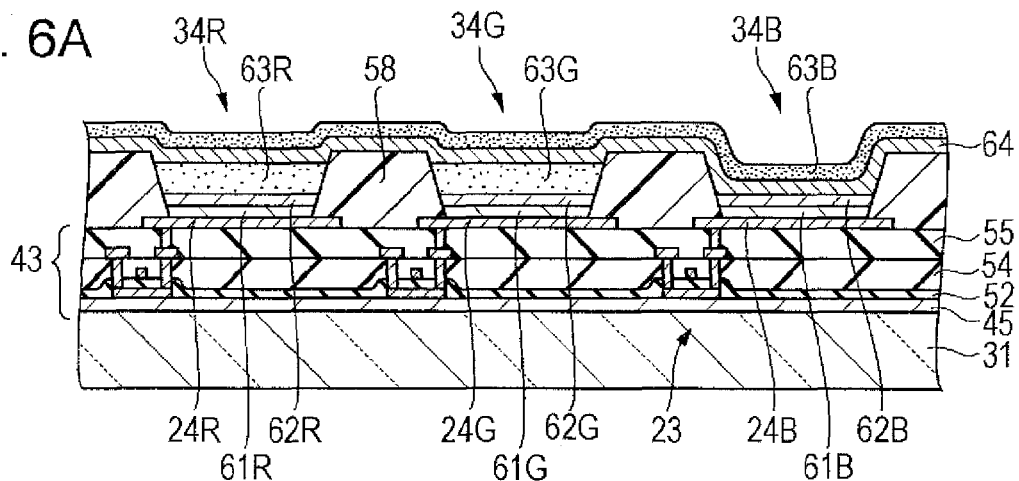
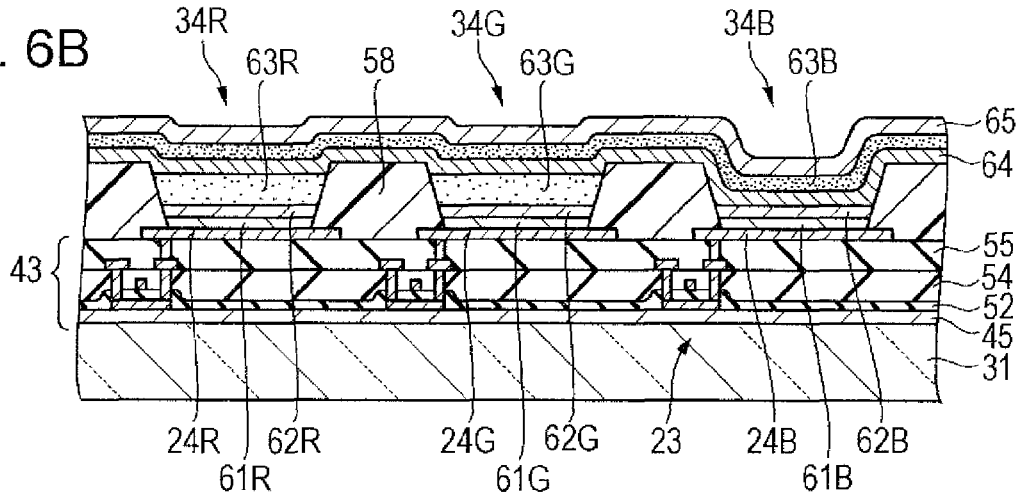
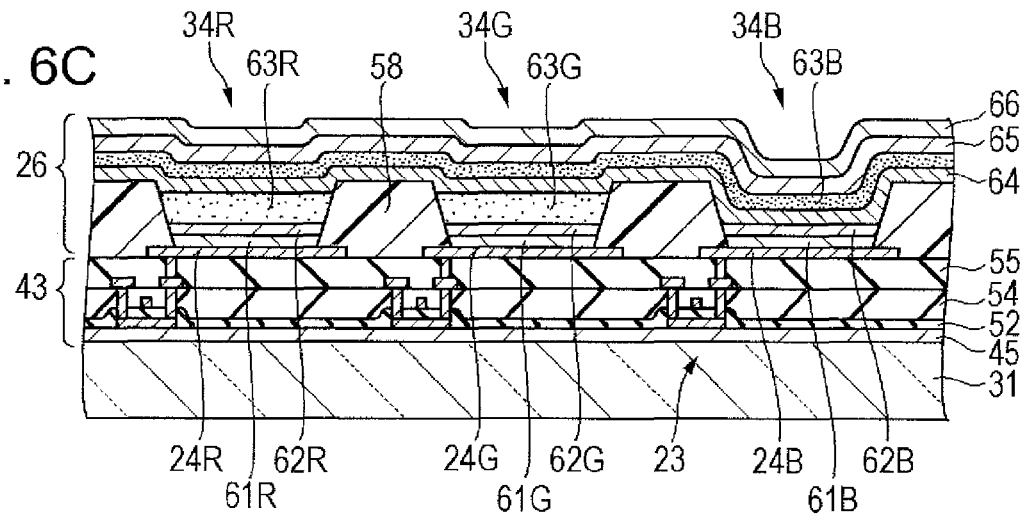

ORGANIC EL DEVICE, METHOD FOR MANUFACTURING THE SAME, AND ELECTRONIC APPARATUS

BACKGROUND

1. Technical Field

The present invention relates to an organic EL device, a method for manufacturing the organic EL device, and an electronic apparatus.

2. Related Art

An organic EL (electroluminescence) device has a structure in which a function layer composite including a luminescent layer is disposed between an anode and a cathode. The function layer composite may include a hole injection layer, a hole transport layer, a luminescent layer, and an electron transport layer in that order from the anode side. By applying a voltage between the anode and the cathode, holes and electrons are injected respectively from the electron transport layer and the hole transport layer to the luminescent layer and are thus recombined with each other, thereby emitting light.

The luminescent layer of the organic EL device is formed, for example, by liquid application (liquid phase process) such as an ink jet method, or by vapor deposition (gas phase process). In the ink jet method, an ink composition containing a luminescent material is discharged from an ink jet head to a predetermined region (sub-pixel) in which the luminescent layer will be formed, and the discharged ink composition is dried to form a luminescent layer. Such liquid application has advantages of facilitating patterning, facilitating the formation of a layer over a wide area, and allowing materials to be efficiently used.

However, the blue (B) luminescent layer formed by liquid application has not yet reached a level at which it can be put into practical use, while the red (R) and green (G) luminescent layers formed by liquid application are at a level at which they can be put into practical use in terms of, for example, luminous efficiency and lifetime. On the other hand, the blue luminescent layer formed by vapor deposition exhibits a sufficient luminous efficiency and emission lifetime for practical use.

JP-A-2007-73532 and JP-A-2011-108462 disclose an organic EL device and a method for manufacturing the organic EL device that includes a red and a green luminescent layer formed by liquid application, and a blue luminescent layer formed by vapor deposition over the entire surface of the structure, including the surfaces of the red luminescent layer and the green luminescent layer.

However, in the organic EL device disclosed in these patent documents, in which the blue luminescent layer is disposed on the red and green luminescent layers, some of the holes injected into the red or green luminescent layer from the anode may pass through the red or green luminescent layer to reach the blue luminescent layer and recombine with electrons to emit blue light in the blue luminescent layer. Consequently, red light from the red luminescent layer and green light from the green luminescent layer are each mixed with the blue light from the blue luminescent layer, and thus color purity is degraded. This is likely to cause the degradation of the color developability of the organic EL device.

SUMMARY

The invention has been made to solve at least some of the above issues, and the following embodiments, or applications, of the invention can be provided.

Application 1

According to an aspect of the invention, an organic EL device having a pixel including sub-pixels is provided. The organic EL device includes a first anode disposed in a first region intended for a first sub-pixel, a second anode disposed in a second region intended for a second sub-pixel, and a cathode disposed over the entirety of the first and second regions. A first luminescent layer is formed by liquid application between the first anode and the cathode and emits light of a first color. A second luminescent layer is formed by vapor deposition over the entirety of the first and second regions, between the first luminescent layer and the cathode and between the second anode and the cathode, and emits light of a second color. A third luminescent layer is disposed at least between the first luminescent layer and the second luminescent layer in the first region, and mainly emits light having a wavelength outside the visible region.

In the organic EL device, in which the third luminescent layer is disposed between the first luminescent layer and the second luminescent layer, holes injected from the anode to the first luminescent layer and further transmitted toward the second luminescent layer through the first luminescent layer recombine with electrons to consume in the third luminescent layer. Accordingly, the number of holes that can reach the second luminescent layer is reduced relative to the number of holes in the case where the third luminescent layer is not provided, and the emission of the second color light from the first sub-pixel is reduced. In addition, if holes and electrons recombine with each other in the third luminescent layer in the first sub-pixel or the second sub-pixel, the third luminescent layer emits light having a wavelength outside the visible region. Therefore, the first color and the second color do not mix with emission from the third luminescent layer. Consequently, the color purities in the first sub-pixel and the second sub-pixel are enhanced, and thus the organic EL device exhibits high color developability.

Application 2

Preferably, the third luminescent layer emits infrared light.

In this instance, since the third luminescent layer emits infrared light, which has a wavelength outside the visible region, holes that have passed through the first luminescent layer can consume without causing the first color and the second color to mix with each other.

Application 3

Preferably, the third luminescent layer contains a porphyrin complex or a phthalocyanine complex.

The third luminescent layer containing a porphyrin complex or a phthalocyanine complex can emit infrared light.

Application 4

Preferably, the third luminescent layer is formed by vapor deposition over the entirety of the first and second regions, including the region between the second anode and the second luminescent layer.

The third luminescent layer formed by vapor deposition can be denser than that formed by liquid application. Also, since the third luminescent layer is formed over the entire region of the first and second sub-pixels, patterning using a precise alignment mask is not required. Accordingly, the productivity of the organic EL device can be enhanced and its cost can be reduced.

Application 5

Preferably, the organic EL device further includes a first hole injection layer between the first anode and the first luminescent layer, and a second hole injection layer between the second anode and the third luminescent layer, and the distance between the second anode and the second luminescent layer is shorter than the distance between the first anode and the second luminescent layer.

By providing the first hole injection layer and the second hole injection layer, holes are efficiently injected from the first anode to the first luminescent layer and from the second anode to the second luminescent layer. In this instance, the first luminescent layer is not present between the second anode and the second luminescent layer in the second sub-pixel, and the distance between the second anode and the second luminescent layer in the second sub-pixel is shorter than the distance between the first anode and the second luminescent layer in the first sub-pixel. Accordingly, the number of holes that can reach the second luminescent layer in the second sub-pixel is increased in comparison with the first sub-pixel. Consequently, the luminous efficiency of the second color light in the second luminescent layer is enhanced. Thus, the organic EL device exhibits higher color developability.

Application 6

Preferably, the organic EL device further includes a third anode in a third region intended for a third sub-pixel, a fourth luminescent layer that is formed over the third anode by liquid application and emits light of a third color, and a third hole injection layer disposed between the third anode and the fourth luminescent layer. In this instance, the cathode is disposed over the entirety of the first, second and third regions such that the fourth luminescent layer is disposed between the third anode and the cathode, and the second and third luminescent layers are disposed over the entirety of the first, second and third regions so as to lie between the fourth luminescent layer and the cathode. The distance between the second anode and the third luminescent layer in the second region is shorter than the distance between the third anode and the third luminescent layer in the third region.

In this structure, the first and fourth luminescent layers are formed by liquid application that facilitates patterning, and the second luminescent layer is formed by vapor deposition. The organic EL device displays full color information because of the presence of these three-color luminescent layers.

Application 7

Preferably, the first color is either red or green, the third color is the other, and the second color is blue.

In the organic EL device of this embodiment, while a red and a green luminescent material are used which can achieve sufficient emission characteristics in practice by being used in highly productive liquid application, a blue luminescent material is used which does not achieve sufficient emission characteristics in practice in liquid application, but can achieve sufficient emission characteristics in practice by being used in vapor deposition. Such an organic EL device can display full color information with high color developability, high luminous efficiency and long emission lifetime.

Application 8

According to still another aspect of the invention, an electronic apparatus including the above-described organic EL device is provided.

The electronic apparatus can display high-quality images and pictures.

Application 9

According to another aspect of the invention, a method is provided for manufacturing an organic EL device including a first sub-pixel, a second sub-pixel and a third sub-pixel. In the method, a first anode is formed in a region intended for the first sub-pixel. A second anode is formed in a region intended for the second sub-pixel. A third anode is formed in a region intended for the third sub-pixel. A first hole injection layer is formed on the first anode. A second hole injection layer is formed on the second anode. A third hole injection layer is formed on the third anode. A first luminescent layer that will emit red light is formed on the first hole injection layer by liquid application. A fourth luminescent layer that will emit green light is formed on the third hole injection layer by liquid application. A third luminescent layer is formed by vapor deposition on the first luminescent layer, the second hole injection layer and the fourth luminescent layer over the entirety of the regions intended for the first, second and third sub-pixels. The third luminescent layer mainly emits infrared light. A second luminescent layer is formed by vapor deposition on the third luminescent layer over the entirety of the regions intended for the first, second and third sub-pixels. The second luminescent layer emits blue light. A cathode is formed on the second luminescent layer over the entirety of the regions intended for the first, second and third sub-pixels.

In the organic EL device produced by the method, the third luminescent layer is disposed between the first luminescent layer and the second luminescent layer, and between the fourth luminescent layer and the second luminescent layer. Thus, holes injected to the first luminescent layer or the fourth luminescent layer from the corresponding anode and going to the second luminescent layer through the first or fourth luminescent layer recombine with electrons to consume in the third luminescent layer. Accordingly, the number of holes that can reach the second luminescent layer is reduced relative to the number of holes in the case where the third luminescent layer is not provided, and blue emission in the first and third sub-pixels is reduced. In addition, if holes and electrons recombine with each other in the third luminescent layer, the third luminescent layer emits light having a wavelength outside the visible region, and thus, red, green and blue emissions are not mixed in the first, second and third sub-pixels. Consequently, the color purity of red emission in the first sub-pixel, the color purity of green emission in the third sub-pixel, and the color purity of blue emission in the second sub-pixel can be enhanced. Furthermore, a red and a green luminescent material that can achieve sufficient emission characteristics in practice by being used in liquid application facilitating patterning are used for the red and green luminescent layers, and a blue luminescent material can also be used for the blue luminescent layer, which does not achieve sufficient emission characteristics in liquid application, but can achieve sufficient emission characteristics in practice by being used in vapor deposition. Thus, an organic EL device can be provided which can display full color information with a high color developability, a high luminous efficiency, and a long emission lifetime.

BRIEF DESCRIPTION OF THE DRAWINGS

The invention will be described with reference to the accompanying drawings, wherein like numbers reference like elements.

FIGS. 6A to 6C are schematic sectional views illustrating the method for manufacturing the organic EL device according to the first embodiment.

DESCRIPTION OF EXEMPLARY EMBODIMENTS

Figure 1:
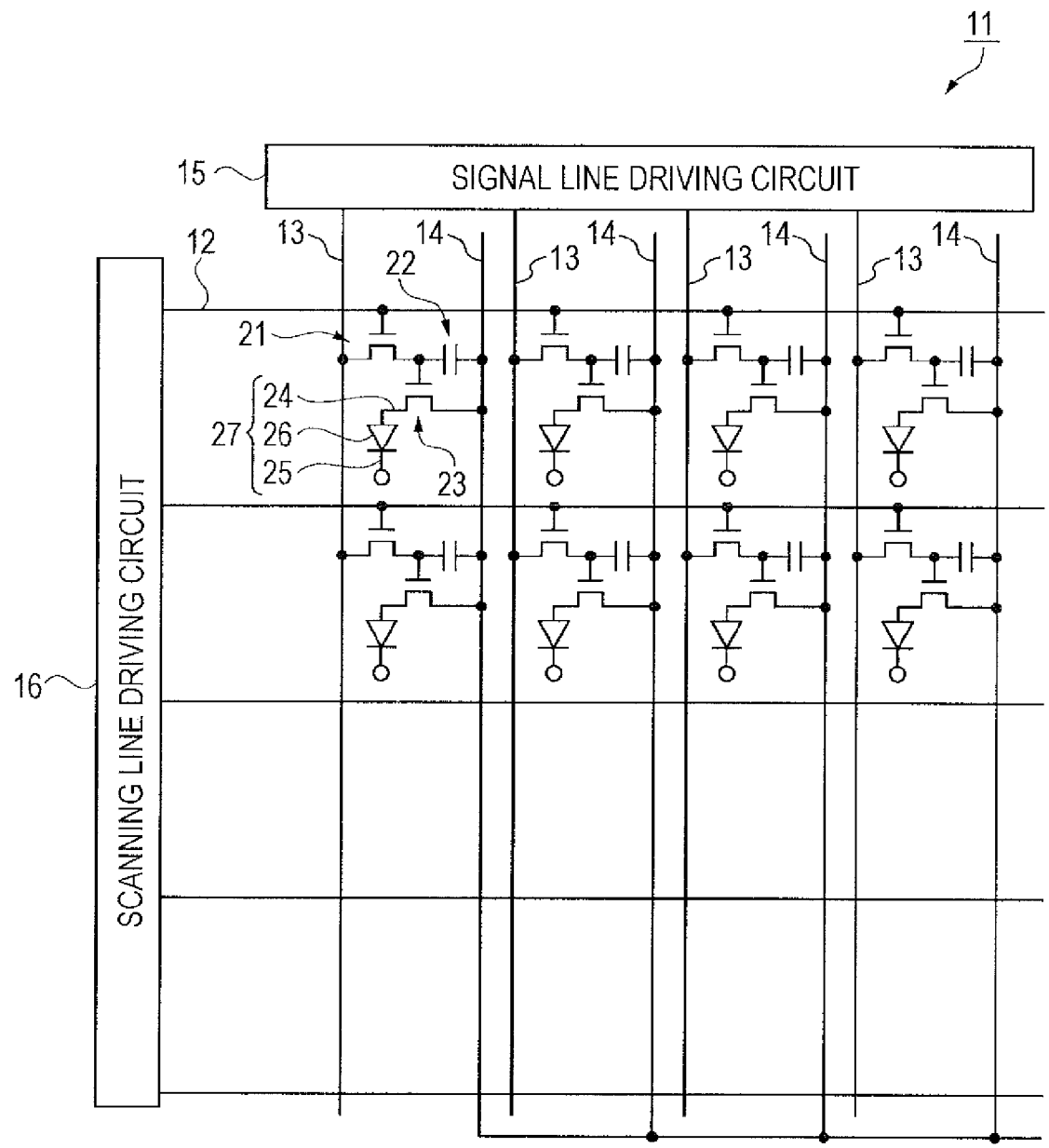
FIG. 1 is an equivalent circuit of the electrical structure of an organic EL device according to a first embodiment of the invention.

Embodiments of the invention will be described below with reference to the drawings. For the sake of visibility, the dimensional proportions of the elements or components shown in the drawings are changed as needed. Parts not necessarily required for description may be omitted from the drawings.

In the following description, something "on a/the substrate" means that it may be disposed directly on the substrate so as to be in contact with the substrate, disposed on the substrate with another member therebetween, or disposed in such a manner that one or some parts of it are in contact with the substrate, but the other is on another member disposed on the substrate.

First Embodiment

Organic EL Device

Figure 2:
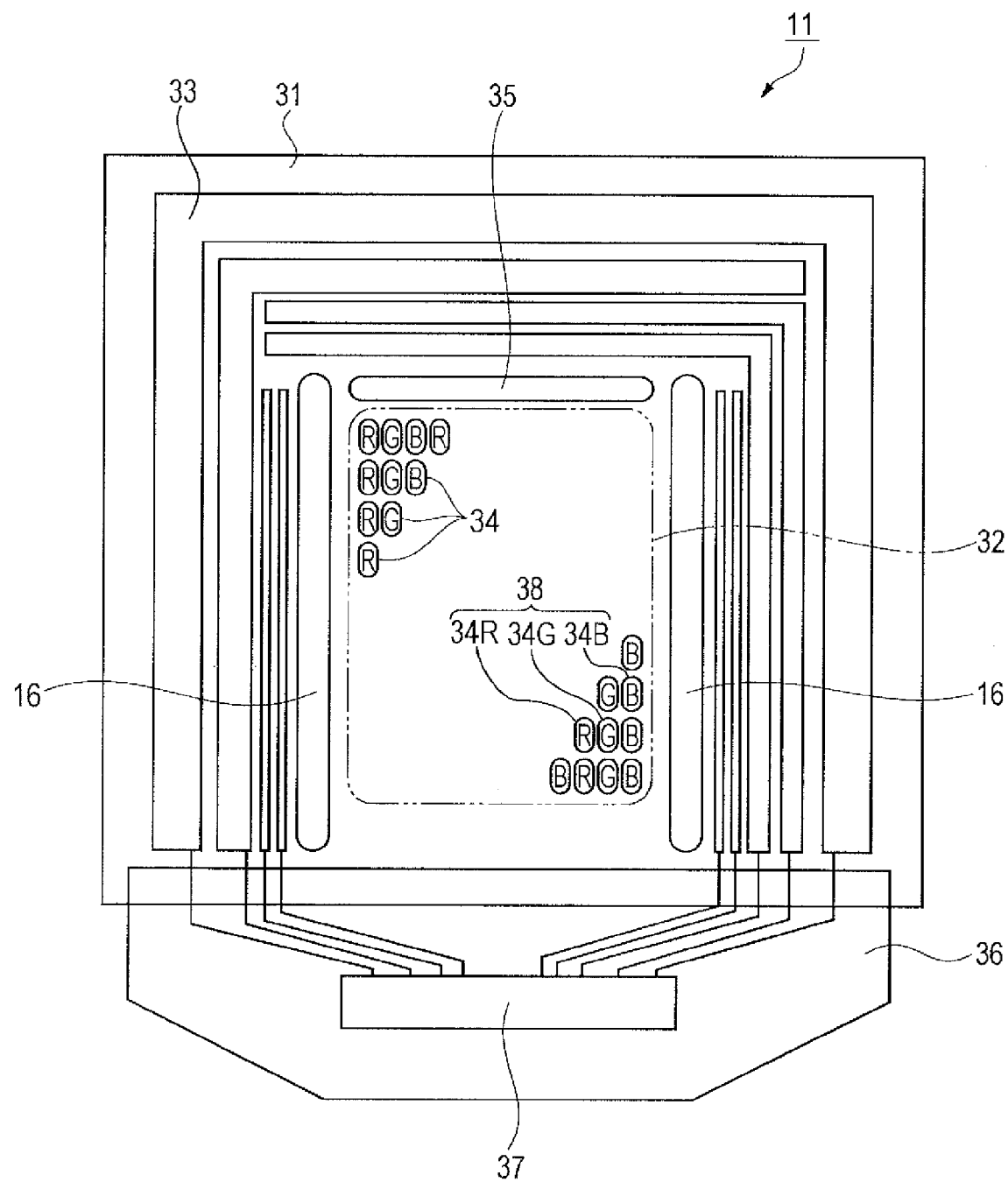
FIG. 2 is a schematic plan view of the organic EL device according to the first embodiment.

The structure of an organic EL device according to a first embodiment of the invention will first be described with reference to the related drawings. FIG. 1 is an equivalent circuit of the electrical structure of an organic EL device according to the first embodiment. FIG. 2 is a schematic plan view of the organic EL device according to the first embodiment.

As shown in FIG. 1, the organic EL device 11 is of the active matrix type, which uses transistors as switching elements. The transistors may be thin-film transistors (hereinafter referred to as TFTs) using a thin-film semiconductor layer, or another type in which the semiconductor substrate has a channel therein.

The organic EL device 11 includes a substrate 31, and wiring on the substrate 31. The wiring include scanning lines 12 disposed on the substrate 31, signal lines 13 extending in a direction intersecting the scanning lines 12, and power lines 14 extending parallel to the signal lines 13. The signal lines 13 are connected to a data line driving circuit 15 including a shift register, a level shifter, a video line, and an analog switch. The scanning lines 12 are connected to a scanning line driving circuit 16 including a shift register and a level shifter.

Regions of sub-pixels 34 are divided with the scanning lines 12 and the signal lines 13. The sub-pixels 34 are each the minimum unit of information displayed on the organic EL device 11, and are arranged, for example, in a matrix manner in a direction in which the scanning lines 12 extend and in a direction in which the signal lines extend. Each sub-pixel 34 includes a switching transistor 21, a driving transistor 23, a hold capacitor 22, an anode 24, a cathode 25 and a light-emitting function layer composite 26.

The anode 24, the cathode 25, and the light-emitting function layer composite 26 including a luminescent layer constitute a light-emitting element 27. The light-emitting element 27 emits light by holes injected from the anode 24 and electrons injected from the cathode 25, recombining with each other in the luminescent layer of the light-emitting function layer composite 26.

In the organic EL device 11, when the switching transistor 21 has been turned on by activating the scanning line 12, an image signal transmitted through the signal line 13 is held in the hold capacitor 22. The state of the hold capacitor 22 determines the state of continuity between the source and drain of the driving transistor 23. Then, when the power line 14 has been electrically connected through the driving transistor 23, a current flows from the power line 14 to the anode 24 and further to the cathode 25 through the light-emitting function layer composite 26.

This current is at a level according to the state of continuity between the source and drain of the driving transistor 23. At this time, the continuity between the source and drain of the driving transistor 23, that is, the continuity of the channel of the driving transistor 23, is controlled by the potential of the gate of the driving transistor 23. Thus, the luminescent layer of the light-emitting function layer composite 26 emits light with a luminance depending on the amount of current between the anode 24 and the cathode 25.

More specifically, when the emission of the light-emitting element 27 is controlled by the driving transistor 23, one of the source and drain of the driving transistor 23 is electrically connected to the power line 14, and the other is electrically connected to the light-emitting element 27.

As shown in FIG. 2, the organic EL device 11 has a light-emitting region 32, which is substantially rectangular in plan view, on the substrate 31. The light-emitting region 32 substantially functions to emit light in the organic EL device 11. The organic EL device 11 may have a dummy region around the light-emitting region 32. The dummy region is substantially not involved in light emission.

In the light-emitting region 32, the sub-pixels 34 are arranged in a matrix manner. Each sub-pixel 34 may be substantially rectangular in plan view. The four corners of the rectangular sub-pixel 34 may be rounded. The shape of such a sub-pixel 34 may be formed with four sides and four curved portions corresponding to the four corners.

In the present embodiment, the organic EL device 11 has a first sub-pixel 34R that emits a first color red (R), a second sub-pixel 34B that emits a second color blue (B), and a third sub-pixel 34G that emits a third color green (G). Corresponding to the sub-pixels 34R, 34G and 34B, a red light-emitting element 27R, a green light-emitting element 27G, and a blue light-emitting element 27B are disposed, respectively. In the following description, in the case in which colors are not distinguished, these sub-pixels and light-emitting elements are simply referred to as sub-pixel(s) 34 and light-emitting element(s) 27.

Around the light-emitting region 32, two scanning line driving circuits 16 and a test circuit 35 are arranged. The test circuit 35 is intended to inspect the operation conditions of the organic EL device 11. A cathode conducting wire 33 is disposed on an outer portion of the substrate 31. A flexible substrate 36 is provided at a side of the substrate 31. The flexible substrate 36 includes a driving IC 37 connected to conductor lines.

In the organic EL device 11, a set of the sub-pixels, one each of 34R, 34G and 43B, define a pixel 38, which a unit for forming an image. By controlling the luminance of each of the sub-pixels 34R, 34G and 34B in the pixel 38 as required, the organic EL device 11 emits light of various colors. Thus, the organic EL device 11 can display full color information and achieve full color emission.

Figure 3:
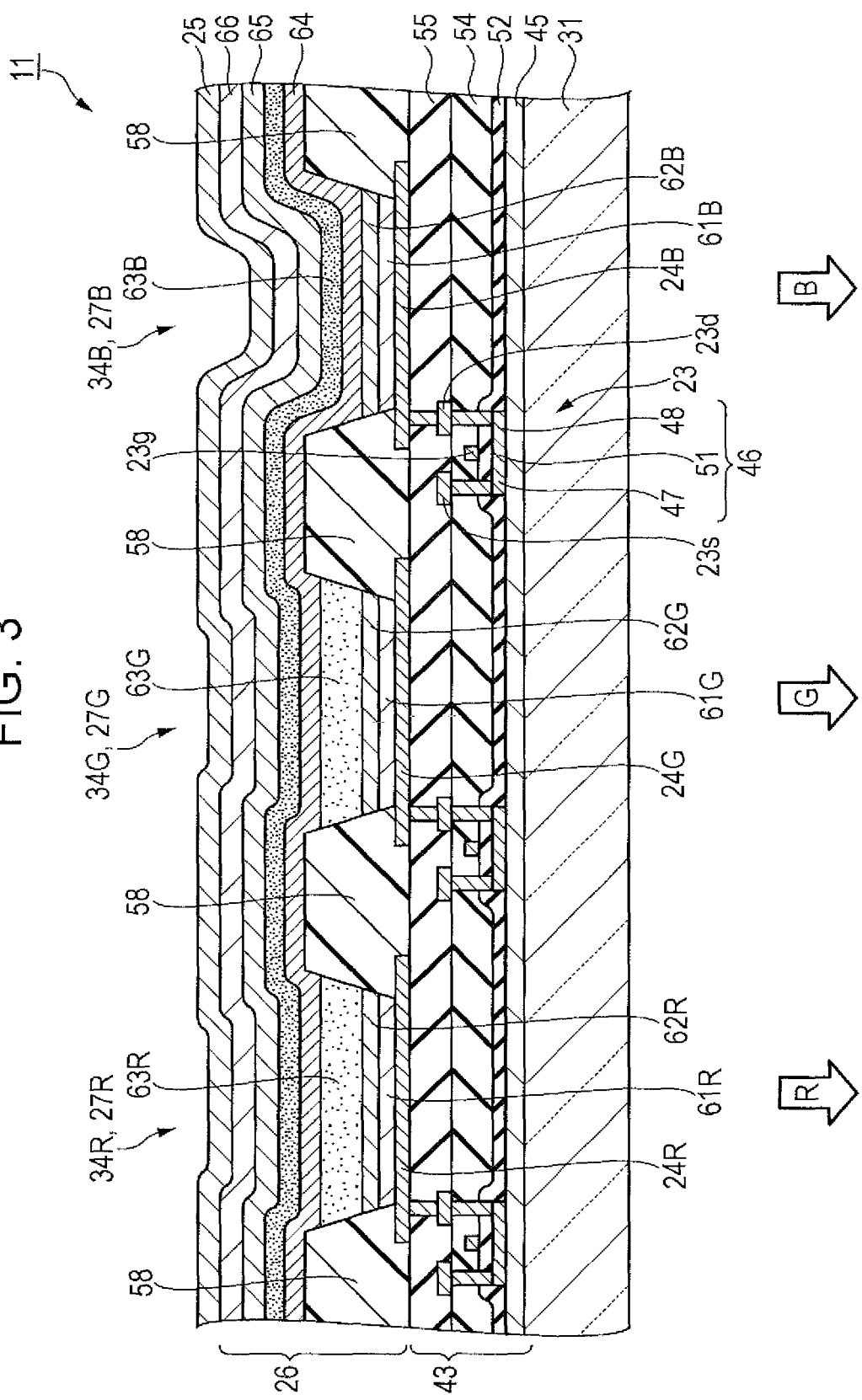
FIG. 3 is a schematic sectional view of the organic EL device according to the first embodiment.

The structure of the organic EL device 11 of the present embodiment will now be described with reference to FIG. 3. FIG. 3 is a schematic sectional view of the organic EL device according to the first embodiment. In the description herein, the cathode 25 side of the organic EL device 11 in FIG. 3 is referred to as the upper side. Also, the term "in plan view" implies that an object is viewed from the upper side in the direction of the normal to the surface of the cathode 25.

As shown in FIG. 3, the organic EL device 11 includes the substrate 31, and a circuit element layer composite 43, anodes 24 (24R, 24G, 24B), partition members (banks) 58, a light-emitting function layer composite 26 and a cathode (common electrode) 25 on the substrate 31. The anodes 24 include a first anode 24R disposed in the first sub-pixel 34R, a second anode 24B disposed in the second sub-pixel 34B, and a third anode 24G disposed in the third sub-pixel 34G. In the following description, in the case in which colors are not distinguished, these anodes are simply referred to as anode(s) 24.

The organic EL device 11 is of the bottom emission type, which emits light produced in the light-emitting function layer composite 26 through the substrate 31 in the light-emitting region 32 (see FIG. 2). Since the organic EL device 11 is of the bottom emission type, the substrate 31 is made of an optically transparent material. Examples of the optically transparent material include glass, quartz, and resin (including plastic film).

The circuit element layer composite 43 includes a base protection layer 45, driving transistors 23, a first insulating interlayer 54, and a second insulating interlayer 55. The base protection layer 45 is formed of, for example, silicon oxide ($SiO_2$) so as to cover the substrate 31.

The driving transistors 23 are formed, one for each of the sub-pixels 34 (34R, 34G, 34B), on the base protection layer 45. Each driving transistor 23 includes a semiconductor layer 46, a gate insulating layer 52, a gate electrode 23g, a drain electrode 23d and a source electrode 23s. The semiconductor layer 46 is formed of polysilicon on the base protection layer 45 in an island manner. In the semiconductor layer 46, a source region 47 and a drain region 48 are formed by doping the semiconductor layer 46. The other region, or undoped region, of the semiconductor layer 46 acts as a channel region 51.

The gate insulating layer 52 is made of a transparent insulating film, such as silicon oxide film, and covers the base protection layer 45 and the semiconductor layer 46. The gate electrode 23g is disposed on the gate insulating layer 52. The gate electrode 23g is formed of, for example, aluminum (Al), molybdenum (Mo), tantalum (Ta), titanium (Ti), or tungsten (W) at a position over the channel region 51 of the semiconductor layer 46.

The first insulating interlayer 54 is formed of, for example, silicon oxide ($SiO_2$) or titanium oxide ($TiO_2$) so as to cover the gate insulating layer 52 and the gate electrodes 23g. In the first interlayer insulating layer 54, the source electrodes 23s and the drain electrodes 23d are formed.

Each source electrode 23s is electrically connected to the source region 47 of the corresponding semiconductor layer 46 through a contact hole formed in the first insulating interlayer 54. Similarly, each drain electrode 23d is electrically connected to the drain region 48 of the corresponding semiconductor layer 46 through a contact hole formed in the first insulating interlayer 54.

The second insulating interlayer 55 is formed of, for example, silicon oxide ($SiO_2$) or titanium oxide ($TiO_2$) so as to cover the first insulating interlayer 54, the source electrodes 23s and the drain electrodes 23d. The second insulating interlayer 55 may be made of acrylic resin or the like.

The anodes 24 (24R, 24G, 24B) are formed, one for each of the sub-pixels 34 (34R, 34G, 34B), on the second insulating interlayer 55. Each anode 24 is substantially rectangular in plan view. The thickness of the anode 24 may be, but is not limited to, about 10 to 200 nm, preferably about 30 to 150 nm. The anode 24 is electrically connected to the drain electrode 23d of the corresponding driving transistor 23 through a contact hole formed in the second insulating interlayer 55.

On the second insulating interlayer 55, the partition members 58 are disposed in a grid-like manner. Each partition member 58 may have a trapezoidal section with inclined sides. The partition member 58 overlaps two adjacent anodes 24 on a region having a predetermined width along the edges of the anodes 24 so that insulation can be ensured between the two anodes 24, and so that the sub-pixel 34 can have a desired shape (for example, a shape like a running track). In other words, the openings defined by the partition members 58 are the regions of the sub-pixels 34.

The partition member 58 may be made of a heat-resistant and solvent-resistant organic material, such as an acrylic resin or a polyimide resin. If a part of the light-emitting function layer composite 26 is formed by liquid application such as an ink jet method as will be described below, it is desirable that the partition member 58 have a lyophobic surface. An inorganic insulating layer may be formed, for example, of silicon oxide ($SiO_2$) between the second insulating layer 55 and the partition members 58.

The sub-pixels 34 (34R, 34G, 34B), that is, light-emitting elements 27 (27R, 27G, 27B) have different structures for each color in the light-emitting function layer composite 26. More specifically, the portion of the light-emitting function layer composite 26 corresponding to the first sub-pixel 34R (red light-emitting element 27R) includes a first hole injection layer 61R, a hole transport layer 62R, and a first luminescent layer (red luminescent layer) 63R, in that order, on the first anode 24R surrounded by the partition members 58. The layers in the first sub-pixel 34R are formed in that order by liquid application.

The portion of the light-emitting function layer composite 26 corresponding to the third sub-pixel 34G (green light-emitting element 27G) includes a third hole injection layer 61G, a hole transport layer 62G, and a fourth luminescent layer (green luminescent layer) 63G on the third anode 24G surrounded by the partition members 58. The layers in the third sub-pixel 34G are formed in that order by liquid application.

The portion of the light-emitting function layer composite 26 corresponding to the second bub pixel 34B (blue light-emitting element 27B) includes a second hole injection layer 612 and a hole transport layer 62B on the second anode 24B surrounded by the partition members 58. These layers are formed in that order by liquid application.

The hole injection layers 61R, 61G and 61B enhance the efficiency of hole injection from the anodes 24R, 24G and 24B, respectively. The thicknesses of the hole injection layers 61R, 61G and 61B may be, but are not limited to, about 5 to 100 nm, preferably about 5 to 50 nm, and more preferably about 10 to 40 nm. In the following description, in the case in which colors are not distinguished, these hole injection layers are simply referred to as hole injection layer(s) 61.

The hole transport layers 62R, 62G and 62B accelerate the transport of the injected holes to the luminescent layers 63R, 63G, and 63B, respectively. The thicknesses of the hole transport layers 62R, 62G and 62B may be, but are not limited to, about 5 to 100 nm, preferably about 10 to 50 nm. In the following description, in the case in which colors are not distinguished, these hole transport layers are simply referred to as hole injection layer(s) 62. The hole transport layers 62R, 62G and 62B are not necessarily required for the sub-pixels 34R, 34G and 34B.

The thicknesses of the luminescent layers 63R and 63G may be, but are not limited to, about 10 to 150 nm, preferably about 20 to 100 nm, and more preferably about 50 to 80 nm.

On the first and fourth luminescent layers 63R and 63G, the hole transport layer 623 and the partition members 58, the third luminescent layer 64 that mainly emits infrared light having a wavelength outside the visible region is disposed over the entire region of the sub-pixels 34R, 34G and 34B. Preferably, the third luminescent layer or infrared luminescent layer 64 is formed by vapor deposition. If the infrared luminescent layer 64 is formed by liquid application on the first and fourth luminescent layers 63R and 63G formed by liquid application, the first and fourth luminescent layers 63R and 63G may be melted or altered in the process step of forming the infrared luminescent layer 64. This can adversely affect color developability. By forming the infrared luminescent layer 64 by vapor deposition, such an adverse effect on the luminescent layers 63R and 63G can be diminished. The infrared luminescent layer 64 formed by vapor deposition can be denser than that formed by liquid application.

The thickness of the infrared luminescent layer 64 may be, but is not limited to, about 1 to 50 nm, preferably about 5 to 20 nm. An infrared luminescent layer 64 having an excessively large thickness consumes a large number of holes that should be transported to the second luminescent layer 63B from the second anode 24B in the second sub-pixel 34B. This leads to a reduced luminous efficiency of the second luminescent layer 63B.

On the infrared luminescent layer 64, the second luminescent layer (blue luminescent layer) 63B that emits blue light is formed by vapor deposition over the entire region of the sub-pixels 34R, 34G and 34B. Since the infrared luminescent layer 64 and the blue luminescent layer 63B are formed over the entire region of the sub-pixels 34R, 34G and 34B, patterning using a precise alignment mask is not required. Accordingly, the productivity of the organic EL device 11 can be increased and its cost can be reduced. The thickness of the blue luminescent layer 63B may be, but is not limited to, about 5 to 100 nm, preferably about 10 to 50 nm.

On the blue luminescent layer 63B, an electron transport layer 65 is formed by vapor deposition. The electron transport layer 65 accelerates the transport to the luminescent layers 63R, 63G and 63B of holes injected from the cathode 25. The thickness of the electron transport layer 65 may be, but is not limited to, about 1 to 100 nm, preferably about 5 to 50 nm. The electron transport layer 65 is not necessarily required.

On the electron transport layer 65, an electron injection layer 66 is formed by vapor deposition. The electron injection layer 66 increases the efficiency of electron injection from the cathode 25. The thickness of the electron injection layer 66 may be, but is not limited to, about 0.01 to 100 nm, preferably about 1 to 10 nm.

The hole injection layers 61R, 61G and 61B, the hole transport layers 62R, 62G and 62B, the luminescent layers 63R, 63G and 63B, the infrared luminescent layer 64, the electron transport layer 65, and the electron injection layer 66 constitute the light-emitting function layer composite 26. In the light-emitting function layer composite 26, the distance between the second anode 242 and the second luminescent layer 632 in the second sub-pixel 34B is shorter than the distances between the first anode 24R and the second luminescent layer 63B in the first sub-pixel 34R and between the third anode 24G and the second luminescent layer 63B in the third sub-pixel 34G.

In other words, the total thickness of the hole injection layer 61B, the hole transport layer 62B and the infrared luminescent layer 64 in the second sub-pixel 343 is smaller than the total thickness of the hole injection layer 61R or 61G, the hole transport layer 62R or 62G, the luminescent layer 63R or 63G, and the infrared luminescent layer 64 in the sub-pixels 34R and 34G. Consequently, the number of holes that can reach the blue luminescent layer 63B is increased in the second sub-pixel 34B in comparison with the first and third sub-pixels 34R and 34G, so that the luminous efficiency of blue light in the blue luminescent layer 63B is increased.

On the light-emitting function layer composite 26 (more specifically, on the electron injection layer 66), the cathode 25 is disposed over the entire surface of the structure on the substrate 31. The thickness of the cathode 25 may be, but is not limited to, about 50 to 1000 nm, preferably about 100 to 500 nm.

On the cathode 25, a sealing substrate (not shown) is disposed. The sealing substrate protects the light-emitting elements 27 (27R, 27G, 27B) from oxygen, moisture and external force. The sealing substrate may be bonded to the cathode 25 with an adhesive of, for example, epoxy resin. The sealing substrate may be flat or concave, and may be made of glass or metal.

The organic EL device 11, which includes the first and third luminescent layers 63R and 63G formed by liquid application (liquid phase process) such as an ink jet method and the second luminescent layer 63B formed by vapor deposition (gas phase process), can display full color information with three primary colors.

The liquid application has advantages of facilitating patterning, facilitating the formation of a large-area layer, and allowing materials to be efficiently used, and is thus superior in productivity. Although red and green luminescent layers formed by liquid application exhibit sufficiently good properties in practice, including luminous efficiency and lifetime (durability in continuous operation), the properties of a blue luminescent layer formed by liquid application have not yet reached a practical level. On the other hand, blue luminescent layers formed by vapor deposition exhibit, for example, sufficiently good properties in practice, including luminous efficiency and lifetime. These properties of some of the blue luminescent layers are superior to those of the red or green luminescent layer formed by liquid application.

In the organic EL devices disclosed in the above-cited patent documents JP-A-2007-73532 and JP-A-2011-108462, a blue luminescent layer is formed by vapor deposition on a red and a green luminescent layer formed by liquid application. Therefore, some of holes injected from the anode to the red or green luminescent layer reach the blue luminescent layer through the red or green luminescent layer. The holes having reached the blue luminescent layer recombine with electrons in the blue luminescent layer, thus undesirably producing blue emission. Consequently, red light from the red luminescent layer and green light from the green luminescent layer are each mixed with the blue light from the blue luminescent layer, and thus color purity is degraded. This is likely to cause the degradation of the color developability of the organic EL device.

The organic EL device 11 of the present embodiment is the same as the organic EL devices disclosed in JP-A-2007-73532 and JP-A-2011-108462 in that the second luminescent layer 63B formed by vapor deposition is disposed over the entire region of the sub-pixels 34R, 34G and 34B, overlying the first and fourth luminescent layers 63R and 63G in the first and third sub-pixels 34R and 34G.

However, the organic EL device 11 has the infrared luminescent layer 64 between the first luminescent layer 63R and the second luminescent layer 63B and between the fourth luminescent layer 63G and the second luminescent layer 63B. Consequently, holes moving to the second luminescent layer 63B through the first luminescent layer 63R or the fourth luminescent layer 63G recombine with electrons to consume in the infrared luminescent layer 64 disposed between the first luminescent layers 63R and the second luminescent layer 63B and between the fourth luminescent layer 63G and the second luminescent layer 63B. Thus, the number of holes that can reach the second luminescent layer 63B is reduced in the first and third sub-pixels 34R and 34G in comparison with the case in which the infrared luminescent layer 64 is not formed, and the emission of undesired blue light in the first and third sub-pixels 34R and 34G is reduced.

When holes and electrons recombine with each other in the infrared luminescent layer 64 in the sub-pixels 34R, 34G and 34B, the infrared luminescent layer 64 emits infrared light. Infrared light does not mix with the colors of the emission in the sub-pixels 34R, 34G and 34B. Consequently, the color purity of each color in the sub-pixels 34R, 34G and 34B is enhanced, and the organic EL device 11 exhibits high color developability.

Materials of Layers

The materials of layers in the organic EL device 11 will now be described. The anode 24 is made of, preferably, but not limited to, a material having a high work function and a high conductivity. The anode 24 may be made of a metal oxide such as indium tin oxide (ITO), indium zinc oxide (IZO), $In_3O_3$, $SnO_2$, F-containing $SnO_2$, Sb-containing $SnO_2$, ZnO, Al-containing ZnO, or Ga-containing ZnO; or an elemental metal such as Au, Pt, Ag, or Cu, or an alloy containing these metals. These materials may be used singly or in combination. Since the anode 24 must be optically transparent, optically transparent metal oxides are suitable.

The hole injection layer 61 may be made of, preferably, but not limited to, an ion conductive hole injection material that is an electroconductive polymer (or electroconductive oligomer) doped with an electron-acceptable dopant, from the viewpoint of forming the hole injection layer 61 by liquid application.

Examples of such an ion conductive hole injection material include polythiophene-based materials such as PEDOT/PSS (poly(3,4-ethylenedioxythiophene)-poly(styrenesulfonate)) and polyaniline-based materials such as PANI/PSS (polyaniline-poly(styrenesulfonate)).

The hole transport layer 62 may be made of, but not limited to, a material containing triphenylamine polymer such as TFB (poly(2,7-(9,9-di-n-octylfluorene)-alt-(1,4-phenylene-((4-sec-butylphenyl)imino-1,4-phenylene)))) expressed by the following formula 1. Such a material allows the hole transport layer 62 to be formed by liquid application.

Formula 1

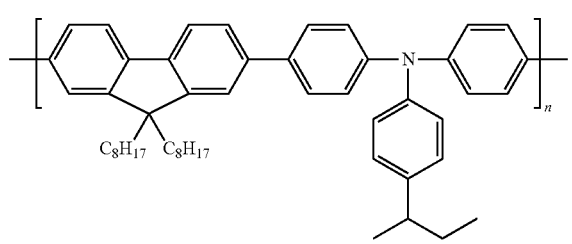

The materials of the first and fourth luminescent layers 63R and 63G are preferably, but are not limited to, those that can be dissolved or dispersed in a liquid, from the viewpoint of forming these layers by liquid application. Such a material is preferably a polymer or low-molecular-weight luminescent material that can be dissolved in a solvent or dispersed in a dispersion medium.

For example, the red luminescent layer, or first luminescent layer, 63R may be made of ADS-111RE (poly[{9,9-dihexyl-2,7-bis(1-cyanovinylene)fluorenylene}-alt-co-{2,5-bis(N,N-diphenylamino)-1,4-phenylene}]), expressed by the following formula 2, produced by American Dye Source, Inc.

Formula 2

For example, the green luminescent layer, or fourth luminescent layer, 63G may be made of ADS-109GE (poly[(9,9-dioctyl-2,7-bis{2-cyanovinylenefluorenylene})-alt-co-(2-methoxy-5-{2-ethylhexyloxy}-1,4-phenylene)]) expressed by the following formula 3, produced by American Dye Source, Inc.

Formula 3

The infrared luminescent layer 64 may be made of a material, acting as a host material, doped with an infrared luminescent material as a guest material. The infrared luminescent guest material is preferably a porphyrin complex or a phthalocyanine complex. The porphyrin complex may be 2,3,7,8,12,13,17,18-octaethyl-21H,23H-porphine iron (III) chloride expressed by formula 4 or 2,3,7,8,12,13,17,18-octaethyl-21H,23H-porphine nickel (II) expressed by formula 5. Furthermore, 5,10,15,20-tetraphenyl-21H,23H-porphine nickel (II) expressed by formula 6 or platinum (II) 2,3,7,8,12,13,17,18-octaethyl-21H,23H-porphyrin expressed by formula 7.

Formula 4

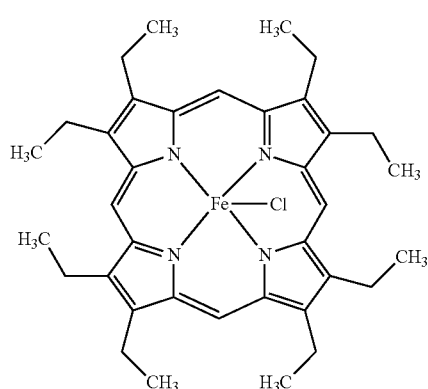

Formula 5

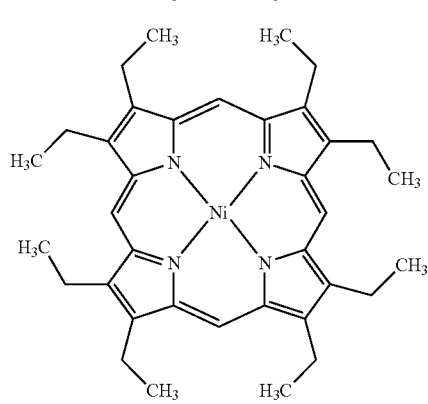

Formula 6

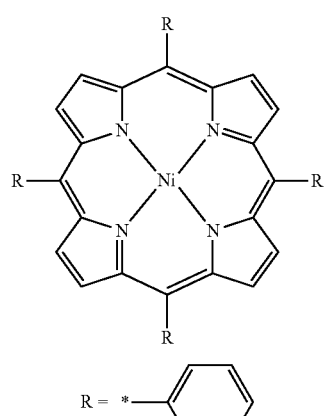

Formula 7

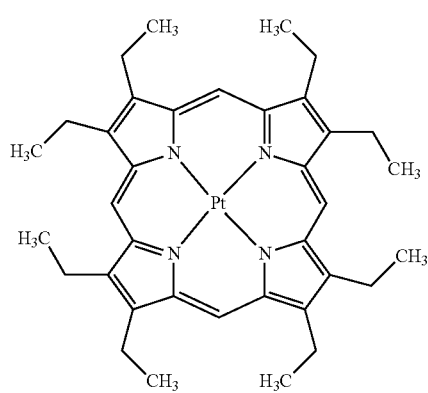

The host material of the infrared luminescent layer 64 may be, but is not limited to, a metal complex such as Alq3 (tris (8-hydroxyquinolinato) aluminium) expressed by formula 8, or a carbazole derivative such as 4,4'-bis(N-carbazolyl)-1,1'-biphenyl expressed by formula 9. The guest material content (amount of doping) in the infrared luminescent layer 64 is preferably in the range of about 0.1% to 20% by weight relative to the host material.

Formula 8

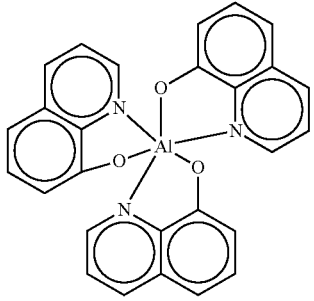

Formula 9

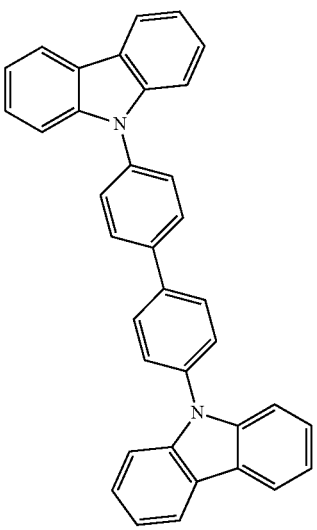

The material of the blue luminescent layer, or second luminescent layer, 63B may be, but is not limited to, 4,4'-bis(2,2-diphenyl-ethen-1-yl)biphenyl expressed by formula 10, which is a styryl derivative. This material allows the blue luminescent layer 63B to be formed by vapor deposition.

Formula 10

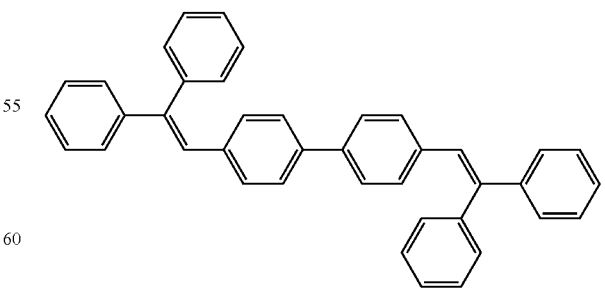

The blue luminescent layer 63B may be made of a material, acting as a host material, doped with a blue luminescent material as a guest material. The host material helps the recombination of holes and electrons to form excitons, and transfers the energy of the excitons to the blue luminescent material (Ferster transfer or Dexter transfer) to excite the blue luminescent material. The blue luminescent material or guest material is efficiently excited to emit light by the function of the host material.

Such a host material may be an anthracene derivative such as 9,10-di(naphth-2-yl)anthracene expressed by formula 11, 9-(4-(naphth-1-yl)-phenyl)-10-(naphth-2-yl)anthracene expressed by formula 12, or 9,9'-di(biphenyl-2-yl)-bianthracene expressed by formula 13.

Formula 11

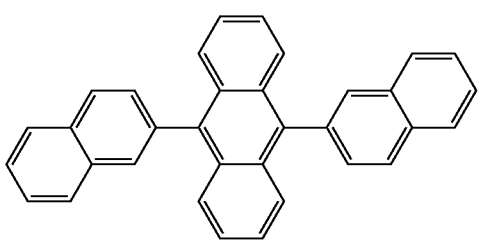

Formula 12

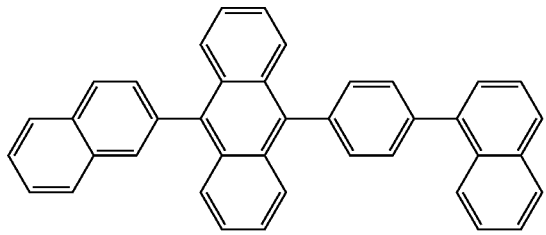

Formula 13

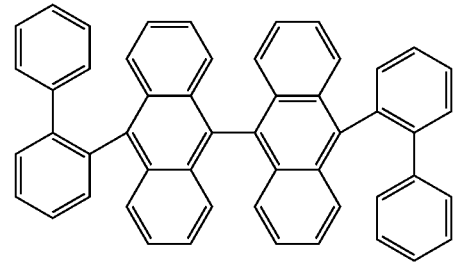

The guest material (blue luminescent material) may be a styryl derivative such as any of the compounds expressed by formulas 14, 15 and 16. These compounds may be used singly or in combination.

Formula 14

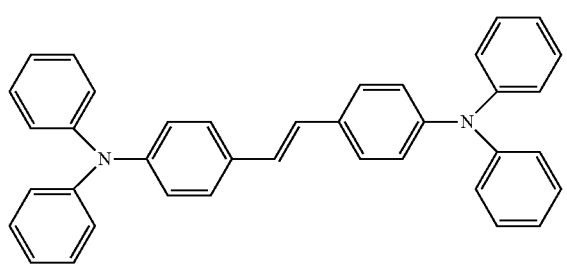

Formula 15

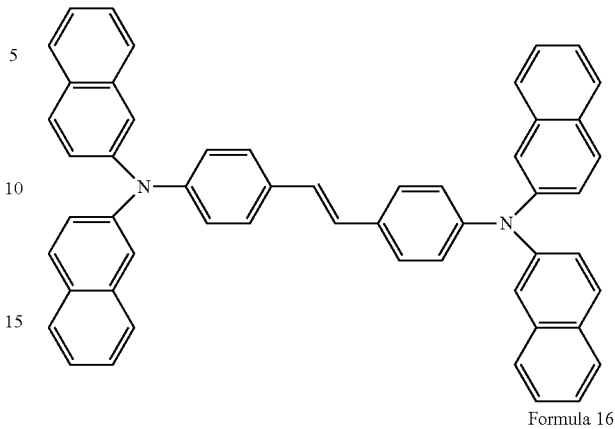

Formula 16

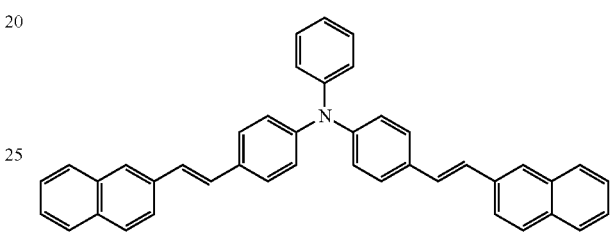

The guest material content (amount of doping) in the blue luminescent layer 63B may be about 0.1% to 20% by weight, preferably about 0.5% to 10% by weight, relative to the host material. By controlling the guest material content in such a range, the luminous efficiency of the blue luminescent layer 63B can be optimized.

The electron transport layer 65 may be made of, but is not limited to, an organic metal complex including 8-quinolinol or its derivative as a ligand, such as Alq3 expressed by the foregoing formula 8 or Liq (8-hydroxyquinolinolato-lithium), or any other quinoline derivative. Other compounds that can be suitably used as the material of the electron transport layer 65 include oxzdiazole derivatives such as tBu-PBD (2-(4'-tert-butylphenyl)-5-(4"-biphenyl)-1,3,4-oxadiazole) and BND (2,5,-bis(1-naphthyl)-1,3,4-oxadiazole), silole derivatives, pyridine derivatives, pyrimidine derivatives, quinoxaline derivatives, and imidazole derivatives. These compounds may be used singly or in combination.

The electron injection layer 66 contains an electron injection material and a metal. Examples of the electron injection material include alkali metals, alkaline-earth metals, rare earth metals, alkali metal salts (carbonates, fluorides, chlorides, etc.), alkaline-earth metal salts (carbonates, fluorides, chlorides, etc.), rare earth metal salts (carbonates, fluorides, chlorides, etc.), and metal complexes. At least one of these electron injection materials is combined with a metal.

Exemplary alkali metals include Li, Na, K, Rb, and Cs. Exemplary alkaline-earth metals include Mg, Ca, Sr, and Ba. Exemplary rare earth metals include Nd, Sm, Y, Tb, and Eu. Exemplary alkali metal salts include LiF, $Li_2CO_3$, LiCl, NaF, $Na_2CO_3$, NaCl, CsF, $Cs_2CO_3$, and CsCl.

Exemplary alkaline-earth metal salts include $CaF_2$, $CaCO_3$, $SrF_2$, $SrCO_3$, $BaF_2$, and $BaCO_3$. Exemplary rare earth metal salts include $SmF_3$ and $ErF_3$. The metal complex may be an organic metal complex containing 8-quinolinol or its derivative as a ligand, such as Alq3 or Liq. The metal used with the above-described electron injection material may be Ag, Al, Cu, or Au.

The cathode 25 is preferably made of a material having a low work function. From the viewpoint of forming the cathode 25 by vapor deposition, the material of the cathode 25 can be, for example, Li, Mg, Ca, Sr, La, Ce, Er, Eu, Sc, Y, Yb, Ag, Cu, Al, Cs, Rb or Au, or an alloy containing these metals. These materials may be used singly, or in combination (for example, in a form of a multilayer composite).

Method for Manufacturing Organic EL Device

A method for manufacturing the organic EL device of the first embodiment will now be described with reference to the related drawings. FIGS. 4A to 6C are schematic sectional views illustrating the process for manufacturing the organic EL device of the first embodiment. Operations that can be performed by known techniques are not described in detail.

Figure 4A:
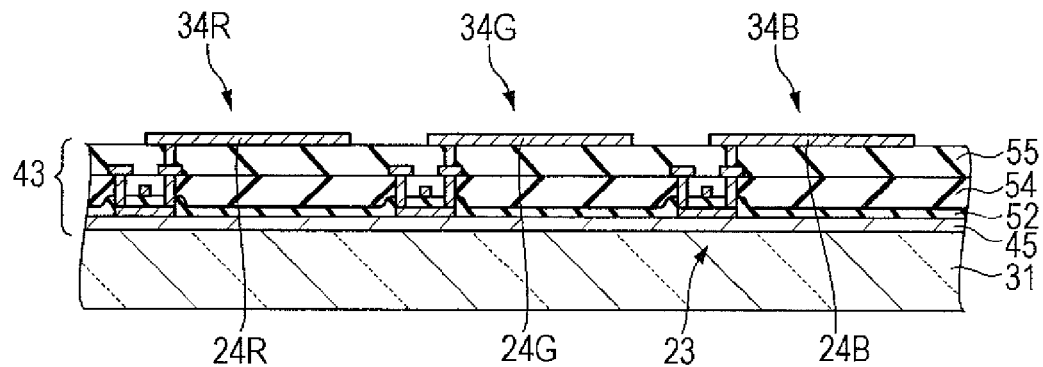
FIGS. 4A to 4C are schematic sectional views illustrating a method for manufacturing the organic EL device according to the first embodiment.

First, as shown in FIG. 4A, a circuit element layer composite 43 (see FIG. 3 for more details) is formed on a substrate 31 by a known film-forming technique or photolithography. Then, ITO anodes 24 (24R, 24G, 24B) are formed for sub-pixels 34 (34R, 34G, 34B), respectively, on the circuit element layer composite 43.

Figure 4B:
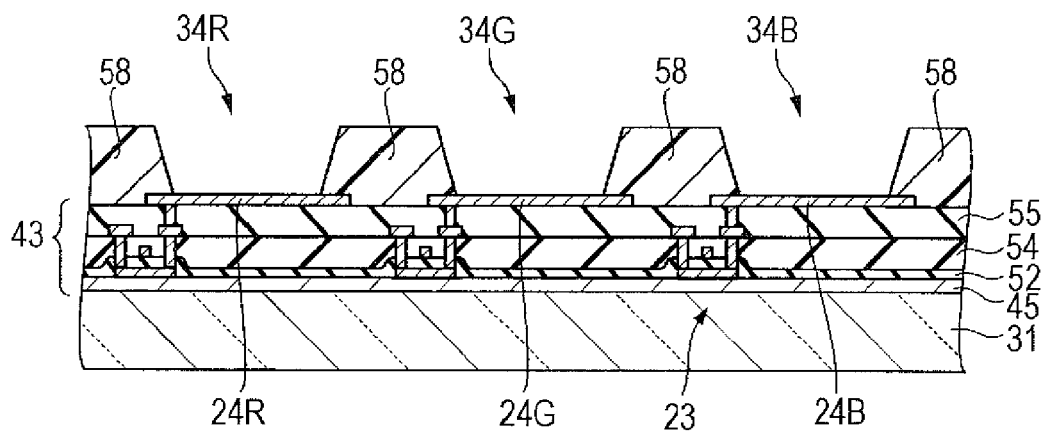
Figure 4C:
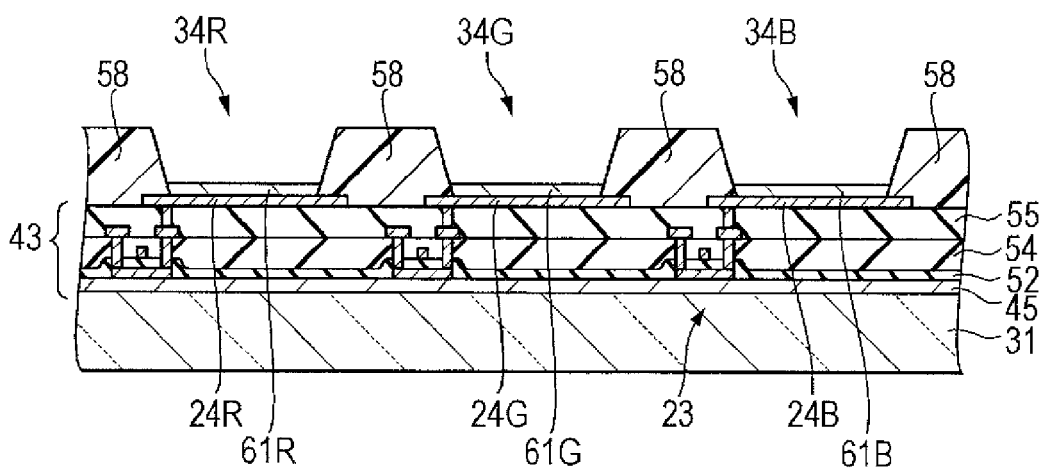

Subsequently, as shown in FIG. 4B, a partition member 58 is formed on the circuit element layer composite 43 and the anodes 24. More specifically, first, a solution containing an acrylic resin as the material of the partition members 58 is applied to the circuit element layer composite 43 (second insulating interlayer 55) and the anodes 24. The coating of the solution is dried to form a partition member layer. The partition member layer is provided with openings therein in regions corresponding to the sub-pixels 34 (34R, 34G, 34B). The partition member 58 is thus completed.

Since some layers of the light-emitting function layer composite 26 are formed by liquid application such as an ink jet method, the partition member 58 desirably have a lyophobic surface. For imparting a lyophobicity to the surface of the partition member 58, for example, a resin (for example, acrylic resin) containing a lyophobic component, such as fluorine, is applied to form a layer of the partition members, and the lyophobic component is dispersed and collected to the surface of the resin layer while the resin layer is being cured.

If an insulating layer is formed between the circuit element layer composite 43 and the partition members 58, the insulating layer is formed of, for example, silicon oxide ($SiO_2$) by chemical vapor deposition (CVD) so as to cover the circuit element layer composite 43 and the anodes 24. Then, openings are formed in the regions of the insulating layer corresponding to the sub-pixels 34 (34R, 34G, 34B) by photolithography and etching.

Subsequently, as shown in FIG. 4O, hole injection layers 61 (61R, 61G, 61B) are formed to a thickness of, for example, about 5 to 100 nm by liquid application on the anodes 24 (24R, 24G, 24B) surrounded by the partition members 58 in the sub-pixels 34 (34R, 34G, 34B), respectively.

More specifically, a functional liquid containing the material of the hole injection layers 61 is ejected onto the anodes 24 by a liquid ejection method, such as an ink jet method. The functional liquid of the hole injection layers 61 can be a solution or dispersion of PEDOT/PSS or PANI/PSS in a solvent or dispersion medium. The coatings of the functional liquid on the nodes 24 are dried, and are then fired in the air to remove the solvent or dispersion medium, thus forming the hole injection layers 61.

Figure 5A:
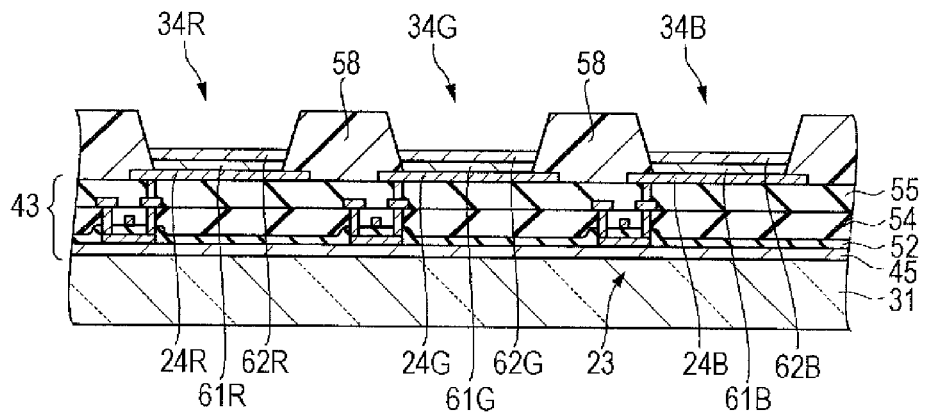
FIGS. 5A to 5C are schematic sectional views illustrating the method for manufacturing the organic EL device according to the first embodiment.

Subsequently, as shown in FIG. 5A, hole transport layers 62 (62R, 62G, 61B) are formed to a thickness of, for example, about 5 to 100 nm by liquid application on the hole injection layers 61 (61R, 61G, 61B) in the sub-pixels 34 (34R, 34G, 34B), respectively.

More specifically, a functional liquid containing the material of the hole transport layers 62 is ejected onto the hole injection layers 61 by a liquid ejection method, such as an ink jet method. The functional liquid of the hole transport layer 62 may be an ink composition prepared by dissolving TFB in cyclohexylbenzene. The coatings of the functional liquid are dried and then fired in a low oxygen atmosphere, thus forming the hole transport layers 62.

Figure 5B:
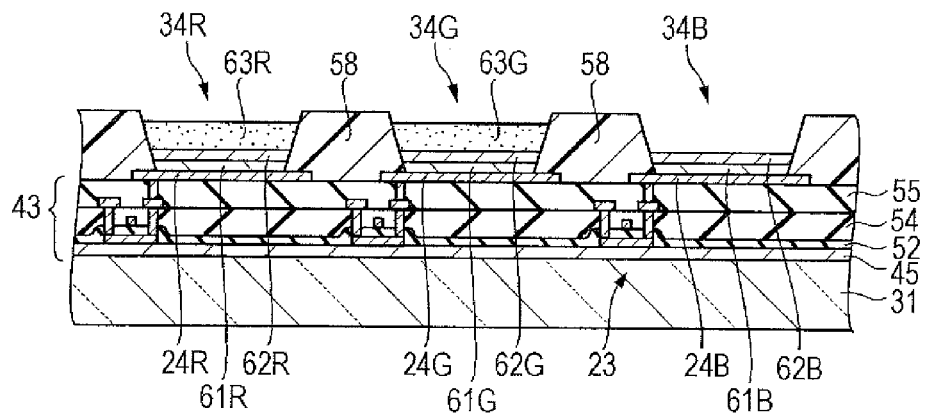

Subsequently, as shown in FIG. 5B, a first luminescent layer 63R is formed to a thickness of, for example, about 10 to 150 nm by liquid application on the hole transport layer 62R in the first sub-pixel 34R. Similarly, a fourth luminescent layer 63G is formed to a thickness of, for example, about 10 to 150 nm by liquid application on the hole transport layer 62G in the third sub-pixel 34G.

More specifically, functional liquids containing a red or green luminescent material are each ejected onto the corresponding hole transport layer 62R or 62G by a liquid ejection method, such as an ink jet method, and the coating of the functional liquid is dried and then fired in an inert gas atmosphere. The functional liquid of a luminescent material may be a solution of the luminescent material expressed by the foregoing formula 2 or 3 in a solvent. The solvent may be cyclohexylbenzene.

Figure 5C:
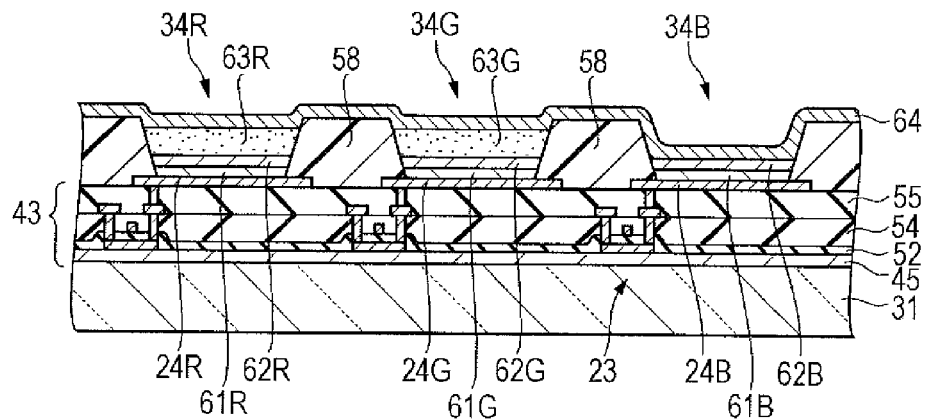

Subsequently, as shown in FIG. 5C, an infrared luminescent layer 64 is formed by vapor deposition on the first luminescent layer 63R in the first sub-pixel 34R, the fourth luminescent layer 63G in the third sub-pixel 34G, the hole transport layer 62B in the second sub-pixel 34B and the partition members 58 over the entire region of the sub-pixels 34R, 34G and 34B. For example, the infrared luminescent layer 64 may be formed to a thickness of about 1 to 50 nm, using a host material, such as a metal complex or a carbazole derivative, and a guest material, such as porphyrin complex, in a proportion of about 0.1% to 20% by weight relative to the host material.

Subsequently, as shown in FIG. 6A, a second luminescent layer 63B is formed by vapor deposition on the infrared luminescent layer 64 over the entire region of the sub-pixels 34R, 34G and 34B. For example, the second luminescent layer 63B is formed to a thickness of about 5 to 100 nm, using a host material such as an anthracene derivative and a guest material such as a styryl derivative in a proportion of about 0.1% to 20% by weight relative to the host material.

Subsequently, as shown in FIG. 6B, an electron transport layer 65 is formed by vapor deposition on the second luminescent layer 63B over the entire region of the sub-pixels 34R, 34G and 34B. For example, the electron transport layer 65 is formed to a thickness of about 1 to 100 nm, using a quinoline derivative or an oxadiazole derivative.

Subsequently, as shown in FIG. 6C, an electron injection layer 66 is formed by vapor deposition on the electron transport layer 65 over the entire region of the sub-pixels 34R, 34G and 34B. For example, the electron injection layer 66 is formed to a thickness of about 0.01 to 100 nm, using an electron injection material and a metal. The light-emitting function layer composite 26 is thus completed.

Subsequently, a cathode 25 is formed on the electron injection layer 66 by vapor deposition, as shown in FIG. 3. For example, the cathode 25 is formed to a thickness of about 50 to 1000 nm, using a metal having a low work function. Then, a sealing substrate (not shown) is bonded to the cathode 25 with, for example, an epoxy adhesive. The organic EL device 11 is thus completed.

As described above, the first embodiment produces the following effects.

(1) Since the infrared luminescent layer 64 is disposed between the red luminescent layer 63R and the blue luminescent layer 63G and between the green luminescent layer 63G and the blue luminescent layer 63B, holes injected to the red and green luminescent layers 63R and 63G from the anodes 24 and moving to the blue luminescent layer 63B through the red or green luminescent layer 63R or 63G recombine with electrons to consume in the infrared luminescent layer 64. Accordingly, the number of holes that can reach the blue luminescent layer 63B is reduced in the red and green sub-pixels 34R and 34G in comparison with the case in which the infrared luminescent layer 64 is not formed, and the emission of undesired blue light in the red and green sub-pixels 34R and 34G is reduced. Consequently, the color purity of red and green emission is enhanced.

(2) The infrared luminescent layer 64 emits infrared light having a wavelength outside the visible region. The infrared light does not mix with the colors of the emission in the sub-pixels 34R, 34G and 34B even though holes and electrons recombine with each other in the infrared luminescent layer 64. Consequently, the color purity of each color in the sub-pixels 34R, 34G and 34B is enhanced, and the organic EL device 11 exhibits high color developability.

(3) Since the infrared luminescent layer 64 contains a porphyrin complex that can emit infrared light having a wavelength outside the visible region, which does not mix with the red, green or blue color of the light in the sub-pixels 34R, 34G and 34B, the infrared luminescent layer 64 can consume holes that have passed through the red or green luminescent layer 63R or 63G.

(4) Since the infrared luminescent layer 64 is formed by vapor deposition, the infrared luminescent layer 64 is denser than an infrared luminescent layer formed by liquid application. Also, since the infrared luminescent layer 64 is formed over the entire region of the sub-pixels 34R, 34G and 34B, patterning using a precise alignment mask is not required. Accordingly, the productivity of the organic EL device 11 can be enhanced and its cost can be reduced.

(5) Since the hole injection layers 61R, 61G and 61B are provided, holes can be efficiently injected from the anodes 24R, 24G and 24B to the luminescent layers 63R, 63G and 63B, respectively. In this instance, in the second sub-pixel 34B, in which the first or fourth luminescent layer 63R or 63G is not provided between the second anode 24B and the second luminescent layer 63B, the distance between the second anode 24B and the second luminescent layer 63B is shorter than the distances between the first anode 24R and the first luminescent layer in the first sub-pixel 34R and between the third anode 24G and the fourth luminescent layer 63G in the third sub-pixel 34G. Consequently, the number of holes that can reach the second luminescent layer 63B in the second sub-pixel 34B is larger than in the first and third sub-pixels 34R and 34G, and accordingly the luminous efficiency of the second luminescent layer 63B is increased. Thus, the organic EL device 11 exhibits high color developability.

(6) While a red and a green luminescent material that can achieve sufficient emission characteristics in practice by being used in highly productive liquid application are used for the red and green luminescent layers 63R and 63G, a blue luminescent material is used for the blue luminescent layer 63B, which does not achieve sufficient emission characteristics in liquid application, but can achieve sufficient emission characteristics in practice by being used in vapor deposition. Thus, the present embodiment can provide an organic EL device 11 that can display full color information with high color developability, high luminous efficiency and long emission lifetime.

Second Embodiment

Electronic Apparatus

Figure 7:
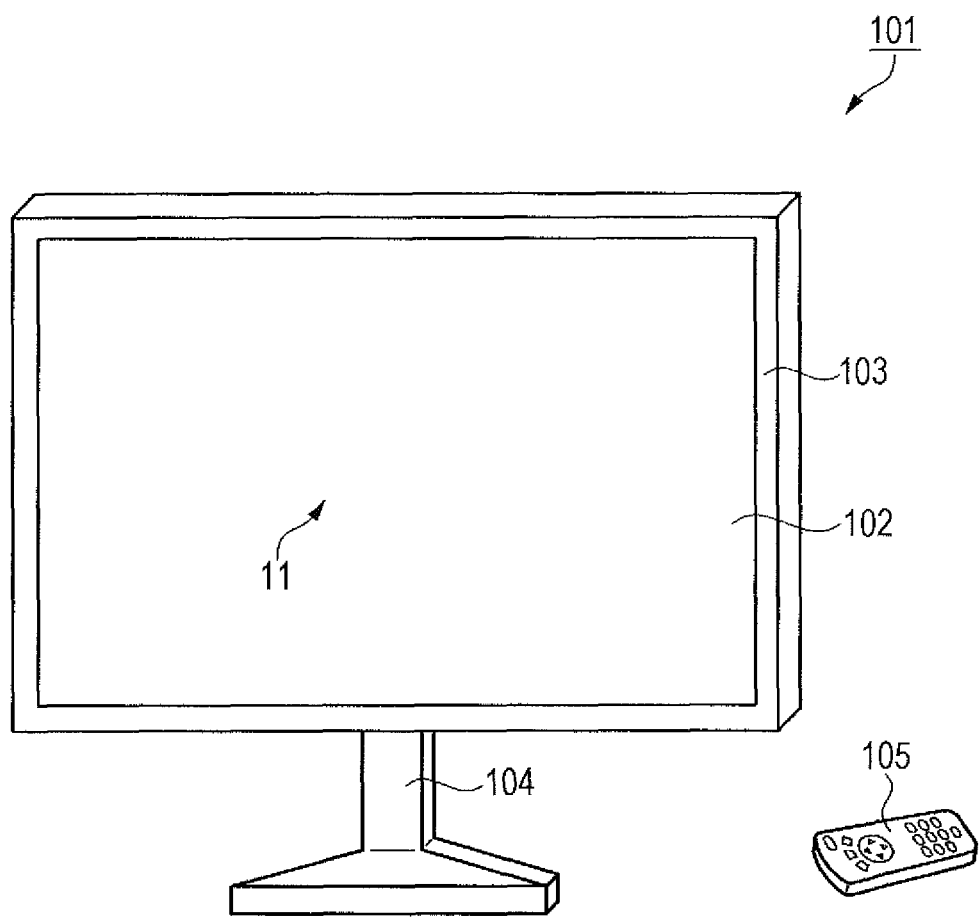
FIG. 7 is a schematic perspective view of a TV set that is an electronic apparatus according to a second embodiment of the invention.

An electronic apparatus according to a second embodiment of the invention will now be described. FIG. 7 is a schematic perspective view of a TV set that is an electronic apparatus according to a second embodiment of the invention. The structure of the TV set of the second embodiment will be described with reference to FIG. 7.

As shown in FIG. 7, the TV set 101 includes a display portion 102, a frame 103, a leg 104, and a remote controller 105. The display portion 102 includes the organic EL device 11 of the first embodiment therein. The frame 103 supports the display portion 102. The leg 104 fixes the display portion 102 and the frame 103 at a predetermined height. The remote controller 105 is used, for example, for turning on or off the power of the TV set 101 and for changing channels.

Since the display portion 102 includes the organic EL device 11 of the first embodiment, the TV set 101 exhibits a high color developability, a high luminous efficiency, and a long emission lifetime.

In another embodiment, any other electronic apparatus may be provided, such as a display panel, a cellular phone, a mobile computer, a digital camera, a digital video camera, a car navigation system, or an audio equipment. These electronic apparatuses including the organic EL device 11 of the first embodiment can exhibit a long emission lifetime, a high luminous efficiency and a high color developability.

The above embodiments are described by way of example, and various modifications may be made within the scope of the invention. For example, the following modifications may be made.

Modification 1

Although the infrared luminescent layer 64 of the organic EL device 11 of the first embodiment is provided over the entire region of the sub-pixels 34R, 34G and 34B, it is not limited to this structure in other embodiments of the invention. For example, the infrared luminescent layer 64 may be formed selectively on the first and third luminescent layers 63R and 63G in the first and third sub-pixels 34R and 34G by, for example, liquid application. Consequently, in the second sub-pixel 34B not provided with the infrared luminescent layer 64, the number of holes that can reach the second luminescent layer 63B from the second anode 24B is increased, and thus the luminous efficiency of blue light can be enhanced.

Modification 2

Although the infrared luminescent layer or the third luminescent layer 64 emits infrared light in the first embodiment, the third luminescent layer is not limited to this. The light emitted from the third luminescent layer can have any wavelength except wavelengths in the visible region, and may be UV light.

Modification 3

Although the organic EL device 11 of the first embodiment has three types of sub-pixels 34R, 34G and 34B so as to emit three color lights of red, green and blue, the invention is not limited to this embodiment. The organic EL device may include two types of sub-pixels, either a red sub-pixel 34R or a green sub-pixel 34G and a blue sub-pixel 343, so as to emit two color lights, or may further include at least one sub-pixel that emits another color light in addition to the red, green and blue sub-pixels 34R, 34G, and 34B.

Modification 4

Although the organic EL device 11 of the first embodiment is of the bottom emission type, the organic EL device of other embodiments is not limited to this type. In an embodiment, the organic EL device may be a top-emission type, in which light is emitted through the cathode 25 from the light-emitting function layer composite 26. In a top emission organic EL device, the cathode 25 may be made of a metal or an alloy, such as MgAg, MgAl, MgAu, or AlAg.

The entire disclosure of Japanese Patent Application No. 2012-219135, filed Oct. 1, 2012 is expressly incorporated by reference herein.

What is claimed is:

1. An organic EL device having a pixel including sub-pixels; the organic EL device comprising:
    a first anode disposed in a first region intended for a first sub-pixel;
    a second anode disposed in a second region intended for a second sub-pixel;
    a cathode disposed over the entirety of the first and second regions;
    a first luminescent layer formed by liquid application between the first anode and the cathode in the first region, the first luminescent layer emitting light of a first color;
    a second luminescent layer formed by vapor deposition over the entirety of the first and second regions, between the first luminescent layer and the cathode and between the second anode and the cathode, the second luminescent layer emitting light of a second color; and
    a third luminescent layer disposed at least between the first luminescent layer and the second luminescent layer in the first region, the third luminescent layer mainly emitting light having a wavelength outside the visible region.

2. The organic EL device according to claim 1, wherein the third luminescent layer emits infrared light.

3. The organic El device according to claim 2, wherein the third luminescent layer contains a porphyrin complex or a phthalocyanine complex.

4. The organic EL device according to claim 1, wherein the third luminescent layer is formed by vapor deposition over the entirety of the first and second regions, including the region between the second anode and the second luminescent layer.

5. The organic EL device according to claim 4, further comprising:
    a first hole injection layer disposed between the first anode and the first luminescent layer; and
    a second hole injection layer disposed between the second anode and the third luminescent layer,
    wherein the distance between the second anode and the second luminescent layer in the second region is shorter than the distance between the first anode and the second luminescent layer in the first region.

6. The organic EL device according to claim 5, further comprising:
    a third anode in a third region intended for a third sub-pixel;
    a fourth luminescent layer formed over the third anode by liquid application, the fourth luminescent layer emitting light of a third color; and
    a third hole injection layer disposed between the third anode and the fourth luminescent layer,
    wherein the cathode is disposed over the entirety of the first, second and third regions such that the fourth luminescent layer is disposed between the third anode and the cathode, and the second and third luminescent layers are disposed over the entirety of the first, second and third regions so as to lie between the fourth luminescent layer and the cathode, and wherein the distance between the second anode and the third luminescent layer in the second region is smaller than the distance between the third anode and the third luminescent layer in the third region.

7. The organic EL device according to claim 6, wherein the first color is one of red and green, the third color is the other, and the second color is blue.

8. An electronic apparatus comprising the organic EL device as set forth in claim 1.

9. An electronic apparatus comprising the organic EL device as set forth in claim 2.

10. An electronic apparatus comprising the organic EL device as set forth in claim 3.

11. An electronic apparatus comprising the organic EL device as set forth in claim 4.

12. An electronic apparatus comprising the organic EL device as set forth in claim 5.

13. An electronic apparatus comprising the organic EL device as set forth in claim 6.

14. An electronic apparatus comprising the organic EL device as set forth in claim 7.

15. A method for manufacturing an organic EL device including a first sub-pixel, a second sub-pixel and a third sub-pixel, the method comprising:
    forming a first anode in a first region intended for the first sub-pixel;
    forming a second anode in a second region intended for the second sub-pixel;
    forming a third anode in a third region intended for the third sub-pixel;
    forming a first hole injection layer on the first anode;
    forming a second hole injection layer on the second anode;
    forming a third hole injection layer on the third anode;
    forming a first luminescent layer that will emit red light on the first hole injection layer by liquid application;
    forming a fourth luminescent layer that will emit green light on the third hole injection layer by liquid application;
    forming a third luminescent layer that will mainly emit infrared light layer, by vapor deposition on the first luminescent layer, the second hole injection layer and the fourth luminescent layer over the entirety of the first, second and third regions;
    forming a second luminescent layer that will emit blue light, by vapor deposition on the third luminescent layer over the entirety of the first, second and third regions; and
    forming a cathode on the second luminescent layer over the entirety of the first, second and third regions.

* * * * *